United States Patent
Björnemo et al.

(10) Patent No.: US 10,878,142 B2
(45) Date of Patent: Dec. 29, 2020

(54) BIPOLE SOURCE MODELING

(71) Applicant: PGS Geophysical AS, Oslo (NO)

(72) Inventors: Lars Erik Magnus Björnemo, Kista (SE); Carl Joel Gustav Skogman, Kista (SE)

(73) Assignee: PGS Geophysical AS, Oslo (NO)

( * ) Notice: Subject to any disclaimer, the term of this patent is extended or adjusted under 35 U.S.C. 154(b) by 673 days.

(21) Appl. No.: 15/280,739

(22) Filed: Sep. 29, 2016

(65) Prior Publication Data

US 2017/0116357 A1 Apr. 27, 2017

Related U.S. Application Data

(60) Provisional application No. 62/246,300, filed on Oct. 26, 2015.

(51) Int. Cl.
*G06F 30/20* (2020.01)
*G01V 3/08* (2006.01)

(52) U.S. Cl.
CPC ............. *G06F 30/20* (2020.01); *G01V 3/083* (2013.01); *G01V 2003/084* (2013.01); *G01V 2003/086* (2013.01)

(58) Field of Classification Search
CPC ............... G06F 17/5009; G01V 3/083; G01V 2003/084; G01V 2003/086
USPC .......................................................... 703/6
See application file for complete search history.

(56) References Cited

U.S. PATENT DOCUMENTS

| 3,387,286 | A * | 6/1968 | Dennard | H01L 27/10805 365/222 |
| 7,801,681 | B2 * | 9/2010 | Pavlov | G01V 3/12 702/7 |
| 8,117,150 | B1 * | 2/2012 | Avera | G01V 11/00 324/347 |
| 8,427,165 | B2 | 4/2013 | Ziolkowski | |
| 8,754,649 | B2 | 6/2014 | Südow | |

(Continued)

OTHER PUBLICATIONS

Folke Engelmark et. al., Inversion of Towed Streamer EM Data in 2.5 and 3D Using Efficient Finite Element and Integral Equation Algorithms, 2014, International Petroleum Technology Conference, pp. 1-5 (Year: 2014).*

(Continued)

*Primary Examiner* — Justin C Mikowski

(57) ABSTRACT

Disclosed are methods and systems for producing bipole source modeling with reduced computational loads. A method may comprise receiving first electromagnetic data and second electromagnetic data from a first shotpoint and a second of a marine electromagnetic survey, modelling a first electromagnetic field and second electromagnetic field for one or more dipole sources of a bipole source and combining a plurality of data points to provide an approximation of an electromagnetic field for the bipole source. A system may comprise electromagnetic sensors, a bipole source, wherein the bipole source comprise a pair of electrodes that are separated by a distance, wherein the bipole source is configured to generate an electromagnetic field, and a data processing system configured to receive electromagnetic data from a plurality of shotpoints of the bipole source and model electromagnetic fields for one or more dipole sources of the bipole source from the electromagnetic data.

14 Claims, 3 Drawing Sheets

(56) References Cited

U.S. PATENT DOCUMENTS

| | | |
|---|---|---|
| 8,898,102 B2 | 11/2014 | Skogman |
| 8,922,214 B2 | 12/2014 | Südow et al. |
| 9,081,106 B2 | 7/2015 | Peppe |
| 2003/0050759 A1 | 3/2003 | Srnka et al. |
| 2005/0237063 A1* | 10/2005 | Wright .................... G01V 3/02 324/336 |
| 2008/0265895 A1 | 10/2008 | Strack et al. |
| 2009/0082970 A1 | 3/2009 | Andreis et al. |
| 2010/0201367 A1* | 8/2010 | Ziolkowski ............ G01V 3/083 324/334 |
| 2014/0129145 A1* | 5/2014 | Bjornemo ................ G01V 3/38 702/2 |
| 2014/0269169 A1* | 9/2014 | van Borselen ....... G01V 1/3861 367/15 |
| 2014/0359265 A1 | 12/2014 | Enstedt et al. |
| 2015/0035537 A1 | 2/2015 | Juhasz |
| 2015/0301217 A1* | 10/2015 | Lindqvist ............... G01V 3/165 324/365 |

OTHER PUBLICATIONS

Nigel Edwards, Marine Controlled Source Electromagnetics: Principles, Methodologies, Future Commercial Applications; Surveys in Geophysics, p. 675-700, vol. 26, 2005.

Seama, N., Tada, N., Goto, T. et al., A Continuously Towed Vertical Bipole Source for Marine Magnetometric Resistivity Surveying, Earth Planets and Space, p. 883-991, vol. 65, Aug. 2013.

Singapore Preliminary Examination Report for Application No. 10201608637U dated Nov. 9, 2016.

Controlled-Source Electromagnetic Approaches for Hydrocarbon Exploration and Monitoring on Land, Rita Streich, published Sep. 3, 2015.

Extended European Search Report for European Application No. 16195161.1-1559 dated Mar. 13, 2017.

Examination Report for MX Application No. 18396, dated Mar. 6, 2019.

Mexican Examination Report for Application No. MX/a/2016/014025, dated Sep. 9, 2019.

* cited by examiner

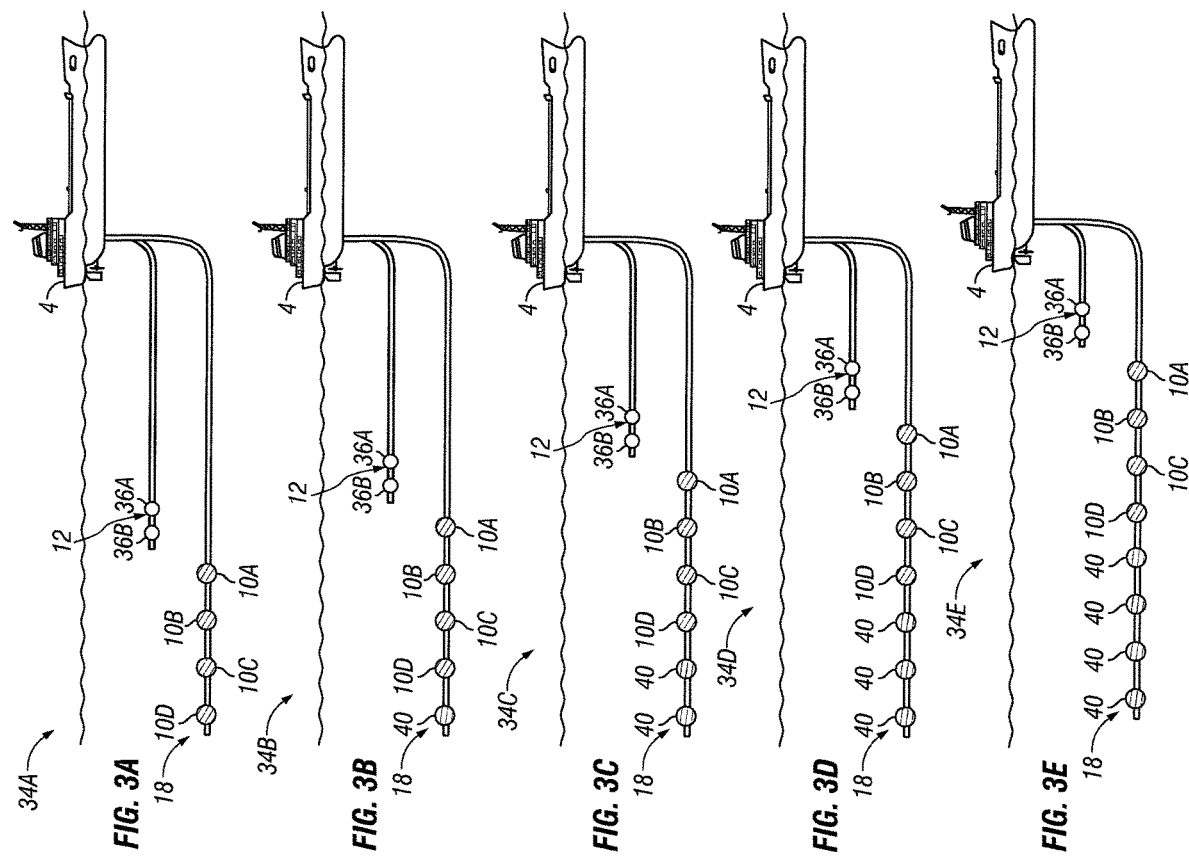

US 10,878,142 B2

BIPOLE SOURCE MODELING

CROSS-REFERENCE TO RELATED APPLICATIONS

The present application claims the benefit of U.S. Provisional Application No. 62/246,300, filed Oct. 26, 2015, entitled "Bipole Source Modeling," the entire disclosure of which is incorporated herein by reference.

BACKGROUND

One type of marine geophysical surveying includes marine electromagnetic surveying, in which geophysical data may be collected or acquired. Marine electromagnetic surveying is used, among other purposes, to infer spatial distribution of electrical subsurface resistivity of formations below the bottom of a body of water, such as a lake or ocean. The spatial distribution of subsurface resistivity is used to assist in determining the presence of hydrocarbon-bearing formations in the subsurface, potentially resulting in cost saving by better targeted drilling operations. Marine electromagnetic surveying generally includes inducing an electromagnetic field in the subsurface formations (e.g., by injecting electrical current in the water), and measuring one or more parameters related to a response of the subsurface formations to the induced electromagnetic field, the response referred to herein as an "electromagnetic earth response." The current may diffuse through the sea water and subsurface formation with an electric potential difference caused by the current measured at some distance away from the electromagnetic source. The resulting electric potential difference may be measured using electromagnetic sensors, for example, that may be distributed on one or more streamers towed by a survey vessel, located on one or more ocean bottom cables, or fixed at nodes at or near a water bottom. The sensitivity of the potential difference to the subsurface resistivity may depend on the sensor offsets and the source signal frequencies.

Data may be collected from the marine electromagnetic survey to obtain information about the subsurface resistivities. The goal is typically to determine the subsurface resistivities as accurately as possible. Determination of the subsurface resistivities using the collected data commonly includes two major steps, commonly referred to as processing and inversion. Processing may be focused on providing good estimates of electromagnetic earth responses while suppressing ambient electromagnetic noise. Inversion may use the estimates of electromagnetic earth responses provided by the processing to search for a distribution of subsurface resistivities that may best fit the electromagnetic earth responses, or the inversion may use the recorded data without previous processing. In examples, the inversion for subsurface resistivities may require the computation of many forward results, which may be computations of synthetic data for a modelled distribution of subsurface resistivities. The processing and inversion may be slowed by the amount of computation used for performing processing and inversion methodologies by a data processing system, which may slow the delivery of a final product to a customer.

BRIEF DESCRIPTION OF THE DRAWINGS

These drawings illustrate certain aspects of some of the embodiments of the present disclosure and may not be used to limit or define the disclosure.

FIG. 3a illustrates a first shotpoint for use in an alternative technique for modelling the bipole source;

FIG. 3b illustrates a second shotpoint for use in an alternative technique for modelling the bipole source;

FIG. 3c illustrates a third shotpoint for use in an alternative technique for modelling the bipole source;

FIG. 3d illustrates a fourth shotpoint for use in an alternative technique for modelling the bipole source; and FIG. 3e illustrates a fifth shotpoint for use in an alternative technique for modelling the bipole source.

DETAILED DESCRIPTION

Figure 1:
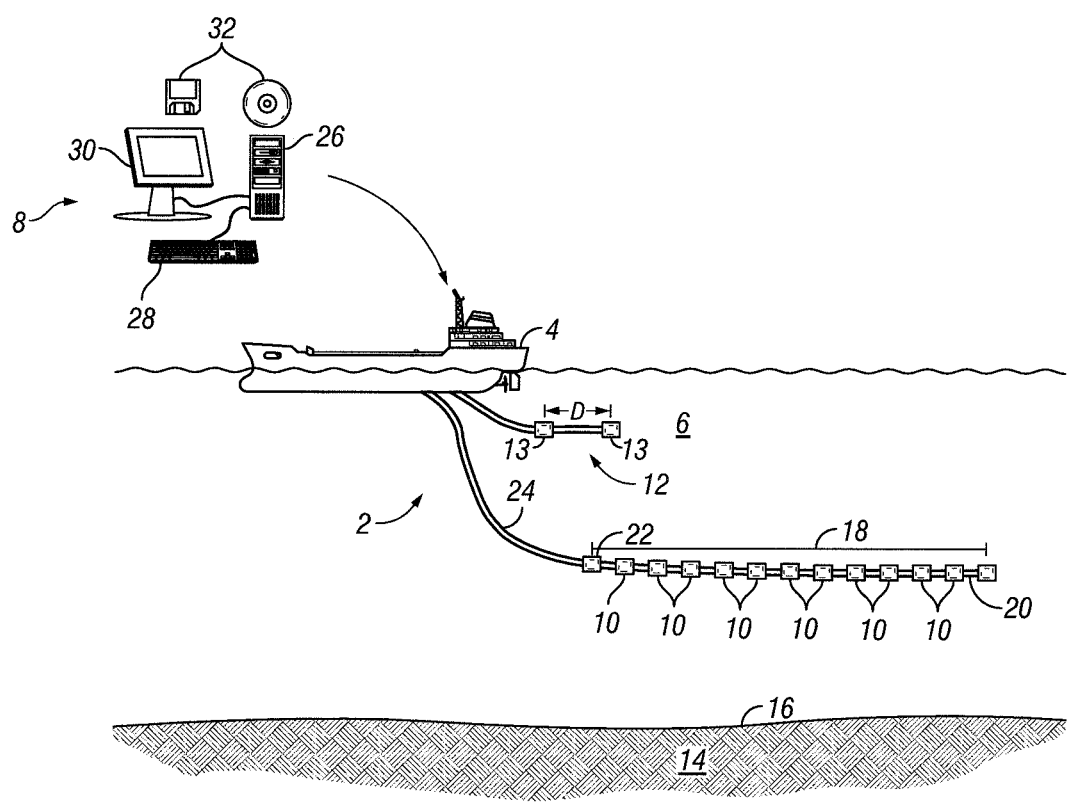
FIG. 1 illustrates an example embodiment of a marine electromagnetic survey system.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The present disclosure relates to marine electromagnetic surveying and, more particularly, to methods of reducing computational loads generated by processing and inversion methodologies. As used herein, the term "inversion" generally refers to the solution to an "inverse problem," wherein an inverse problem is the process of calculating from a set of observations the causal factors that produced them. Commonly, inversion may be implemented as an iterative search for a set of factors, or values of parameters describing these factors, that may fit the observations. Often, an inverse problem does not have a unique solution. In embodiments, the "causal factors" of primary interest in marine electromagnetic surveying may be subsurface resistivities, and the process of estimating them is referred to as an inversion. The term "inversion" is used when the input may not be the observations themselves but the results from processing the observations. As used herein, the term "processing" refers to the calculation of electromagnetic earth responses from observations, with the aim of suppressing the ambient electromagnetic noise. In the present disclosure, this processing is distinct from inversion and is used to refer to disambiguation.

Disclosed below is a method which may include receiving a first electromagnetic data from a first shotpoint of a marine electromagnetic survey, receiving second electromagnetic data from a second shotpoint of the marine electromagnetic survey, modelling a first electromagnetic field for one or more dipole sources of a bipole source from the first electromagnetic data, modelling a second electromagnetic field for the one or more dipole sources from the second electromagnetic data, and combining a plurality of data points to provide an approximation of an electromagnetic field for the bipole source, wherein the data points include the first electromagnetic field and the second electromagnetic field.

Disclosed below is a method for manufacturing a geophysical data product which may include receiving, with the data processing system, electromagnetic data from a plurality of shotpoints of a marine electromagnetic survey. Modelling, with the data processing system, electromagnetic fields for one or more dipole sources of a bipole source from the electromagnetic data and combining, with the data processing system, a plurality of data points to provide an approximation of an electromagnetic field for the bipole source, wherein the data points include the electromagnetic fields for the one or more dipole sources; and recording, with the data processing system, the approximation of the electromagnetic field for the bipole source on one or more non-transitory computer readable media thereby creating the geophysical data product.

Disclosed below is an electromagnetic survey system, which may include electromagnetic sensors, a bipole source, wherein the bipole source includes a pair of electrodes that are separated by a distance, wherein the bipole source is configured to generate an electromagnetic field. A data processing system configured to receive electromagnetic data from a plurality of shotpoints of the bipole source, model electromagnetic fields for one or more dipole sources of the bipole source from the electromagnetic data and combine a plurality of data points to provide an approximation of the electromagnetic field for the bipole source, wherein the data points include the electromagnetic fields for the one or more dipole sources.

Discussed below is a non-transitory computer-readable medium encoded with machine-readable instructions to control one or more processors of a data processing system to perform the operations of: receiving electromagnetic data from a plurality of shotpoints of a marine electromagnetic survey; modelling electromagnetic fields for one or more dipole sources of a bipole source from the electromagnetic data; and combining a plurality of data points to provide an approximation of an electromagnetic field for the bipole source, wherein the data points comprise the electromagnetic fields for the one or more dipole sources.

Referring now to FIG. 1, a marine electromagnetic survey system 2 may be illustrated in accordance with example embodiments. As illustrated, marine electromagnetic survey system 2 may include a survey vessel 4 moving along the surface of a body of water 6, such as a lake or ocean. Survey vessel 4 may include thereon equipment, shown generally at 8 and referred to for convenience as an "information handling system." Information handling system 8 may include devices (none shown separately) for navigating survey vessel 4, such as global positioning system ("GPS") receivers, for actuating at least one bipole source 12, and for recording signals generated by electromagnetic sensors 10. The term "bipole" may describe a source in which electrodes 13, discussed below, may be separated by a non-negligible distance in terms of an electromagnetic field generated at electromagnetic sensors 10. By contrast, the term "dipole" may describe an electromagnetic source, be it real or modelled, in which electrodes 13 may be separated by a negligible distance, and therefore may be considered a point source.

Bipole sources 12 in modelling may be represented by an array of dipole sources, and the electromagnetic field generated by a bipole source 12 may be modelled by integrating (summing) the electromagnetic fields generated by each dipole source in the equivalent array. At a distance, bipole sources 12 in a modelled electromagnetic field may be indistinguishable. Using an array of dipole sources may be a method to model a bipole source 12.

Survey vessel 4 and/or a different vessel (not shown) may tow at least one bipole source 12. In the illustrated embodiment, bipole source 12 may be towed above water bottom 16, wherein bipole source 12 is disconnected from water bottom 16. Bipole source 12 may include a pair of electrodes 13 that are spaced apart a distance D, which is preselected. At selected times bipole source 12 may be actuated to generate an electromagnetic field that travels downwardly through the body of water 6 and formations 14 below water bottom 16. Specifically, bipole source 12 may be activated to generate an electromagnetic field. In examples, bipole source 12 may include a pair of electrodes 13. The electrodes 13 may be separated by any suitable distance D that would be considered a non-negligible distance. A suitable distance of distance D may be about one hundred meters or longer, about two hundred meters or longer, or about five hundred meters or longer. By way of example, the electrodes 13 may be separated by a distance D of about one hundred meters to about one thousand meters, about two hundred meters to about one thousand meters, and/or about five hundred meters to about one thousand meters. Without limitation, bipole source 12 may increase in strength over a longer length.

In some embodiments, survey vessel 4 may further tow a receiver array 18 including a plurality of electromagnetic sensors 10 at spaced apart positions. In the illustrated embodiment, receiver array 18 may be located on a single receiver cable, or "streamer" shown generally at 20, configured to be towable from the survey vessel 4 moving on the surface of the body of water 6. In other embodiments, receiver array 18 may be located on multiple streamers 20 displaced horizontally and/or vertically from one another. In alternative embodiments, receiver array 18 may include electromagnetic sensors 10 located on ocean bottom cables and/or nodes, fixed at or near water bottom 16, either in lieu of or in addition to electromagnetic sensors 10 on streamer 20 (or multiple streamers 20). In still other embodiments, additional electromagnetic sensors 10 may be located on streamers 20 towed by another vessel (not shown). As another alternative, one or more additional streamers (not shown) may be towed behind survey vessel 4, towed behind another vessel (not shown), located on an ocean bottom cable, or on nodes fixed at or near water bottom 16. Non-limiting examples of electromagnetic sensors 10 may include electromagnetic field sensors, such as receiver electrodes and magnetometers. The type(s) and configurations(s) of electromagnetic sensors 10 are not intended to limit the scope of the disclosure. Without limitation, electromagnetic sensors 10 may be used, for example, to acquire electromagnetic data, such as measurements of the potential difference influenced by the electromagnetic earth response of formations 14 below water bottom 16. Specifically, electromagnetic data may be acquired from the marine electromagnetic survey system 2 using the electromagnetic sensors 10. Electromagnetic sensors 10 may measure one or more various electromagnetic field properties, such as voltage, magnetic field amplitude, and/or magnetic field gradient.

Streamer 20 may be coupled at its forward end (with respect to direction of movement of the survey vessel 4) to a termination 22 which may couple the streamer 20 to a lead-in cable 24. Lead-in cable 24 may transmit towing force, power, and/or signals between survey vessel 4 and streamer 20. While not illustrated, streamer 20 may include a number of different devices in addition to electromagnetic sensors 10, such as lateral force and depth control devices (e.g., birds having variable incidence wings) to regulate streamer 20 depth, seismic sensors, depth sensors, velocity sensors, accelerometers, magnetometers, and/or positions sensors, among others. While only a single streamer 20 may be shown, it may be understood that the disclosure is applicable to a receiver array 18 that includes any number of laterally spaced apart streamers 20 towed by survey vessel 4 and/or any other vessel. For example, in some embodiments, two or more of the streamers 20 may be laterally spaced apart and towed by survey vessel 4. "Lateral" or "laterally," in the present context, means transverse to the direction of the motion of survey vessel 4. Lateral positioning of streamers 20 may be maintained by various towed devices (e.g., deflectors, paravanes, doors, etc.) that may generate lateral force as moved through body of water 6. In some embodiments, multiple laterally spaced apart streamers 20 may be towed by survey vessel 4. Accordingly, the number of streamers 20 and their particular geometric configuration in body of water 6 may not considered a limitation on the scope of the present disclosure.

As previously disclosed, electromagnetic sensors 10 may be used to acquire electromagnetic data. The electromagnetic data may contain measurements of various electric field properties of the electromagnetic field generated as a result of the interaction of the induced electromagnetic field with formations 14 below water bottom 16. The measurement may be, for example, induced voltage, magnetic field amplitude and/or magnetic field gradient, such that the electromagnetic data represent one or more electromagnetic field properties. Electromagnetic sensors 10 may acquire electromagnetic data when bipole source 12 generates a source signal. The source signal may be single pulses and/or continuous sweeps of electromagnetic energy. A marine electromagnetic survey typically may include several lines (paths of travel for survey vessel 4) planned to cover the area under consideration with sufficient spatial sampling density. Each line may be divided into shots, where, for a marine electromagnetic survey, a shot may be a spatial sample point for which an electromagnetic earth response may be estimated, rather than a physical "shot" in the seismic sense. In a marine electromagnetic survey, the source signal may be continuous for the whole line, and may be of a single frequency and/or amplitude, or continuously varying. Each electromagnetic shot thus may include one sequence of time domain samples per electromagnetic sensor 10. The source signal from bipole source 12 may also be measured separately.

In accordance with an embodiment of the disclosure, a geophysical data product indicative of certain properties of the formations 14 may be manufactured from the measured electromagnetic signal and electromagnetic earth response thereto. The geophysical data product may include acquired and/or processed electromagnetic data and may be recorded on one or more non-transitory computer readable media. In some embodiments, the geophysical data product may include an approximation of the electromagnetic field for bipole source 12. The geophysical data product may be produced offshore (i.e. by equipment on a vessel) or onshore (i.e. at a facility on land) either within the United States and/or in another country. Specifically, embodiments may include producing a geophysical data product from at least the subsurface resistivities and storing the geophysical data product on a non-transitory computer readable media for importing onshore. If the geophysical data product is produced offshore and/or in another country, it may be imported onshore to a facility in, for example, the United States or another country. Once onshore in, for example, the United States or another country, further processing and/or geophysical analysis may be performed on the geophysical data product.

Geophysical analysis of the geophysical data may be performed by an inversion methodology. In some embodiments, inversion methodologies may include gradient based local searching, stochastic global searching, and/or Newton based search methods. Most methodologies may be performed by computations performed by information handling system 8. FIG. 1 illustrates information handling system 8, which may further include a data processing system 26 that may be utilized in accordance with examples of the present disclosure. Without limitation, information handling system 8 may be disposed on survey vessel 4, another vessel, and/or onshore. Information handling system 8 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, information handling system 8 may be a personal computer, a network storage device, or any other suitable device and may vary in size, shape, performance, functionality, and price. Data processing system 26 may be used for implementation of inversion methodologies. Special or unique software for receiving the inputs, data processing, and sending output signals may be stored in data processing system 26 and/or on non-transitory computer readable media 32. Those of ordinary skill in the art will appreciate that data processing system 26 may include hardware elements including circuitry, software elements including computer code stored on the non-transitory computer readable media 32 or a combination of both hardware and software elements. A processor, not illustrated, such as a central processing unit or CPU, may control the overall operation of data processing system 26.

Data processing system 26 may include random access memory (RAM), one or more processing resources (e.g. a microprocessor) such as a central processing unit (CPU) or hardware or software control logic, ROM, and/or other types of nonvolatile memory. Additional components of information handling system 8 may include one or more of a display device 30, an input device 28 (e.g., keyboard, mouse, etc.) as well as non-transitory computer readable media 32 (e.g., optical disks, magnetic disks) that may store code representative of the above-described methods. Information handling system 8 may also include one or more buses (not shown) operable to transmit communications between the various hardware components. Information handling system 8 may act as a data acquisition system and possibly a data processing system that analyzes measurements, for example, to process one or more properties of an inversion methodology. Data processing system 26 may compute processes such as modelling of electromagnetic fields. Modelling of electromagnetic fields may also be referred to as "forward modelling", wherein forward modelling may be defined as calculating the electric field at electromagnetic sensors 10. Forward modeling may include selecting a set of model parameters and solving a system of equations with the selected model parameters using obtained electromagnetic data. The system of equations may include appropriate versions of Maxwell's equations for marine electromagnetic surveys. Modelling of electromagnetic fields may be based on results from a marine electromagnetic survey, or at least compared to the results from a marine electromagnetic survey for the purpose and may be used in a process of inferring subsurface resistivities through the process of inversion. The marine electromagnetic survey may measure an electromagnetic field based at least in part on bipole source 12 and electromagnetic sensors 10. Bipole source 12 may include electrodes 13 separated by a non-negligible distance, a modelled electromagnetic field may be obtained by integrating the results from several modelled zero length (dipole) sources, distributed over the length of the bipole source 12.

Forward modelling of an electromagnetic field from electromagnetic data found in a marine electromagnetic survey for receiver array 18 may be based on spatial sampling, which may be identified as a distribution of "shotpoints." For example, in modelling, an electromagnetic source, bipole source 12, which may stretch for a distance D of hundreds of meters, may be modelled as a plurality of dipole sources (e.g., dipole sources 36 on FIGS. 2a-2d) at a single point along the actual length of the bipole source 12. For each shotpoint, the position of bipole source 12 and electromagnetic sensors 10 may serve as the bases for calculating a modelled electromagnetic field.

FIGS. 2a-2d illustrate an electromagnetic field modelling technique that includes four different shotpoints 34a-34d for marine electromagnetic survey system 2 in accordance with present embodiments. The shotpoints 34a-34d will be referred to herein collectively as shotpoints 34a-34d and individually as first shotpoint 34a, second shotpoint 34b, third shotpoint 34c, and fourth shotpoint 34d. While FIGS. 2a-2d illustrate a total of four of the shotpoints 34a-34d, it should be understood that embodiments may include more or less than four of the shotpoints 34a-34d. As illustrated, bipole source 12 may be towed by survey vessel 4, and bipole source 12 may be represented in the modelling technique by a plurality of dipole sources 36a-36h. Additionally, survey vessel 4 may tow a plurality of electromagnetic sensors 10a-10d. The electromagnetic sensors 10a-10d—will be referred to herein collectively as electromagnetic sensors 10a-10d and individually as first electromagnetic sensor 10a, second electromagnetic sensor 10b, third electromagnetic sensor 10c, and fourth electromagnetic sensor 10d. Each of electromagnetic sensors 10a-d may record measurements of electromagnetic field properties from an electromagnetic field generated by bipole source 12. The measurement may be, for example, induced voltage, magnetic field amplitude and/or magnetic field gradient, such that the electromagnetic data represent one or more electromagnetic field properties. Accordingly, for each of the shotpoint 34a-34d, bipole source 12 may be activated to generate an electromagnetic field and measurements of electromagnetic sensors 10 may be recorded, for example, to obtain electromagnetic data.

Figure 2A:
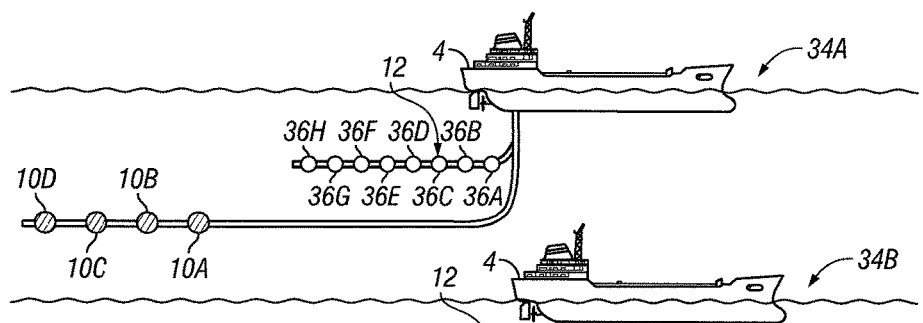
FIG. 2a illustrates a first shotpoint for use in modelling a bipole source.
Figure 2B:
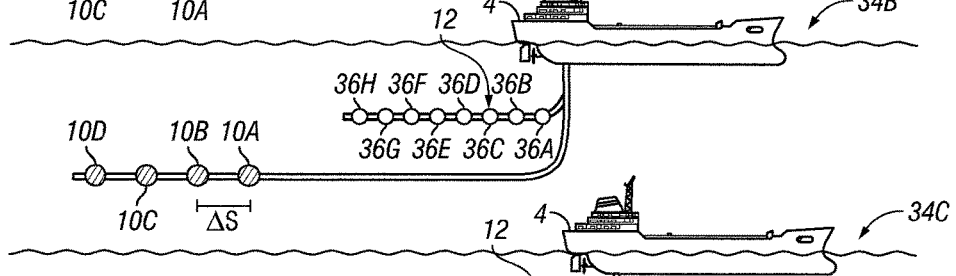
FIG. 2b illustrates a second shotpoint for use in modelling the bipole source.
Figure 2C:
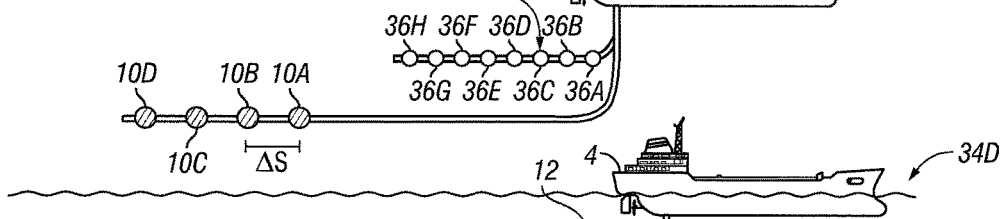
FIG. 2c illustrates a third shotpoint for use in modelling the bipole source.
Figure 2D:
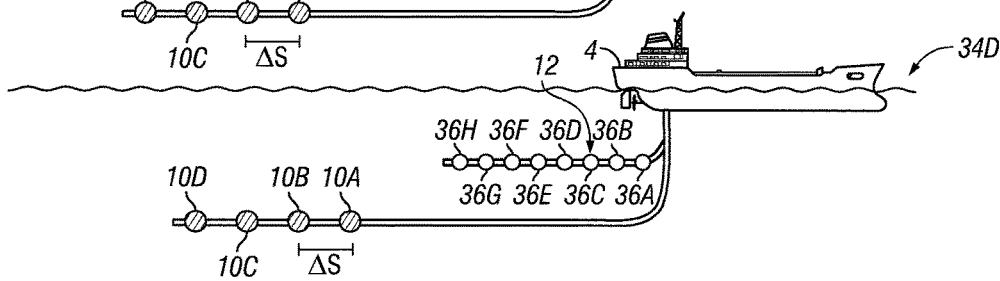
FIG. 2d illustrates a fourth shotpoint for use in modelling the bipole source.

With continued reference to FIGS. 2a-2d, bipole source 12 may be modelled as a plurality of dipole sources 36a-36h, for example, to determine a modelled electromagnetic field. Electromagnetic data recorded by each of electromagnetic sensors 10a-10d may be used in modelling of bipole source 12. In the illustrated embodiment, bipole source 12 is modelled as eight dipole sources 36a-36h, but it should be understood that more or less than eight of the dipole sources 36 may be used for modelling of bipole source 12. The dipole sources 36a-36h may be referred to collectively as dipole sources 36a-36h and individually as first dipole source 36a, second dipole source 36b, and so forth to eight dipole source 36h. Thus, the electromagnetic data recorded by each of electromagnetic sensors 10a-10d may be modelled to integrate over nine solutions from each of the dipole sources 36a-36h. Without limitation, FIGS. 2a-2b illustrate four of the electromagnetic sensors 10a-10d, which may lead to an integration of thirty two possible solutions for each of shotpoints 34a-34d to provide an approximation of the electromagnetic field for bipole source 12, as there may be eight dipole sources 36a-36h for the four electromagnetic sensors 10a-10d and each of the dipole-sensor pairs may be solved for. Each possible solution may increase the amount of computations in which data processing system 26 (e.g., shown on FIG. 1) may perform to obtain a modelled electromagnetic field. Additionally, the computations may be repeated for each of the shotpoints 34a-34d so that a modelled electromagnetic field may be obtained for each of the shotpoints 34a-34d. FIGS. 2a-2d illustrate a total of four shotpoints 34a-34d, each with a potential of thirty two possible solutions, thus providing an increased computational load to obtain modelled electromagnetic fields. It should be noted that the possible number of solutions may rise and/or fall based on the number of electromagnetic sensors 10a-10d and dipole sources 36a-36h, which may not be limited by this disclosure. Each of the shotpoints 34a-34d may be separated by a predetermined spacing, represented by ΔS, and there may be any number of shotpoints 34a-34d within a survey area.

In an effort to reduce computational loads, an alternative modelling method may be utilized in accordance with example embodiments. As illustrated in the embodiments of FIGS. 2a-2d, there may be several dipole-sensor combinations that model each of shotpoints 34a-34d. For example, the combination of the first dipole source 36a and first electromagnetic sensor 10a in first shotpoint 34a on FIG. 2a may be matched by the combination of third dipole source 46c and second electromagnetic sensor 10b in second shotpoint 34b on FIG. 2b. Therefore, many dipole-sensor combinations in second shotpoint 34b of FIG. 2b and beyond may be modelled in first shotpoint 34a of FIG. 2b. Likewise, there may be additional overlap in third shotpoint 34c of FIG. 2c and fourth shotpoint 34d of FIG. 2d for various dipole and sensor combinations.

FIGS. 3a-3d illustrate an electromagnetic field modelling technique to calculate an approximation of the electromagnetic field for the bipole source 12 that may be utilized to reduce computational loads placed on data processing system 26 (e.g., shown on FIG. 1) in accordance with example embodiments. Embodiments of the electromagnetic field modelling technique may use the overlapping dipole and sensor combinations discussed above with respect to FIGS. 2a-2d to reduce computational load. In the illustrated embodiment, a total of five shotpoints 34a-34e are illustrated. However, it should be understood that the electromagnetic field modelling technique may be implemented with more or less than five shotpoints 34a-34e, as desired for a particular application. The alternative field modelling technique may remove the overlap between shotpoints 34a-d by reducing the modelled length of bipole source 12 for each of the shotpoints 34a-34e and by combining modelled results from many shotpoints, such as shotpoints 34a-34e. As illustrated in FIGS. 3a-3d, that correspond to the scenario in FIGS. 2a-2d, bipole source 12 may be modelled with a reduced number of dipole sources 36a-36b in the calculation of the approximation of the electromagnetic field of the bipole source 12. As illustrated, bipole source 12 may be modelled by first dipole source 36a and second dipole source 36b. The length (and number) of dipole sources 36a-36b in each of shotpoints 34a-34e may be reduced such that the dipole sources 36a-36b may only extend a portion of the length of bipole source 12. For example, bipole source 12 may be modelled in each of the shotpoints 34a-34e over only a portion of its length, for example, dipole sources 36 may only extend over 50% or less of the length of bipole source 12. By combination of shotpoints 34a-34e, bipole source 12 may increase, which may reconstruct a previous shotpoint 34. Without limitation, there may be any number of dipole sources 36a-36b in bipole source 12. However, the number of dipole sources 36a-36b in bipole source 12 may be smaller in embodiments of the alternative field modelling technique described herein. Thus, the electromagnetic data recorded by each of electromagnetic sensor 10a-10d may have to be integrated over two solutions, as two dipole sources 36a-36b may be present. This may lead to an integration of two possible solutions for each of electromagnetic sensor 10a-10d, significantly reducing the amount of possible solutions across the survey area, for example, as compared to the technique described above with respect to FIGS. 2a-2d.

To maintain coverage for the integration for all of shotpoints 34a-34e, additional sensor points 40, may be added to the calculations of each of shotpoints 34a-34e, as illustrated in FIGS. 3b-3e. In example embodiments, the addition of sensor points 40 may extend receiver array 18 to include all bipole-sensor offsets that may be used for an inversion method and its corresponding forward modelling solutions. Extending receiver array 18 may not remove the benefits gained from alternative field modelling technique. The extension may be small because receiver array 18 may be longer than bipole source 12. For example, assuming receiver array 18 may be about 8000 meters and bipole source 12 may have a length of 800 meters, in one particular implementation, if bipole source 12 represented by eight dipole sources 36a-36h (e.g., shown on FIGS. 2a-2d) may be instead modelled with an array of two dipole sources 36a-36b (e.g., shown on FIGS. 3a-3d) at the expense of extending the model of receiver array 18 by 800 meters, there may be a ten percent expense to gain a fourfold modelling reduction. It should be understood that these lengths are merely examples and embodiments of receiver array 18 may have length of about 1,000 meters to about 10,000 meters or even longer and embodiments of bipole source 12 may have a length of about 100 meters to about 1,000 meters or even longer. Modelling techniques for marine electromagnetic surveying provide results for models of receiver arrays 18 that are longer at a smaller computational cost than for bipole sources 12 that are longer. Accordingly, embodiments of the alternative field modelling technique disclosed herein may reduce the computational burden on data processing system 26 (e.g., shown on FIG. 1), which may allow information and signals recorded by electromagnetic sensors 10a-10d to be processed faster while maintaining a high quality in a final processed product. Reducing the computational burden may provide a number of benefits, including decrease in processing time, power consumption, and/or the amount of processing power required by data processing system 26 (e.g., shown on FIG. 1).

Referring to FIGS. 3a-3e, an electromagnetic field may be modelled based on electromagnetic data recorded from at least one shotpoint. In accordance with present embodiments, the modelling of the electromagnetic field may result in an approximation of the electromagnetic field for bipole source 12 with less computational burden. The modelling may be performed with a data processing system 26 (e.g., shown on FIG. 1). In some embodiments, electromagnetic data may be received from shotpoints 34a-34e of a marine electromagnetic survey. The electromagnetic data may include information recorded from one or more electromagnetic sensors 10a-10d. In embodiments, the electromagnetic data may be used to model electromagnetic fields for one or more dipole sources 36a-36b of bipole source 12. The electromagnetic fields may then be used to determine an approximation of the electromagnetic field for the bipole source. For example, a plurality of data points may be combined to provide the approximation of the electromagnetic field, wherein the data points include the electromagnetic fields. In some embodiments, combining may include integrating according the data points.

Referring to FIG. 3a, in some embodiments, a first electromagnetic field may be modelled based on first electromagnetic data received from first shotpoint 34a of the marine electromagnetic survey. The first electromagnetic data received for the first shotpoint 34a may be utilized in modelling the first electromagnetic field for one or more dipole sources 36a-36b of bipole source 12. The first electromagnetic data may include information received from one or more electromagnetic sensors 10a-10d. Turning now to FIG. 3b, in some embodiments, a second electromagnetic field may be modelled based on second electromagnetic data received from second shotpoint 34b of the marine electromagnetic survey. The second electromagnetic data received for the second shotpoint 34b may be utilized in modelling the second electromagnetic field for one or more dipole sources 36a-36b of the bipole source. The second electromagnetic data may include information received from one or more electromagnetic sensors 10a-10d. To provide an approximation of the electromagnetic field of the bipole source 12, the first electromagnetic field, the second electromagnetic field, and one or more additional data points may be combined. Combining the data points may include integrating across the first electromagnetic field and the second electromagnetic field.

Referring to FIG. 3c, in some embodiments, a third electromagnetic field may be modelled for use in approximating the electromagnetic field for the bipole source 12. For example, the third electromagnetic field may be modelled based on third electromagnetic data received from third shotpoint 34c of the marine electromagnetic survey. The third electromagnetic data received for the third shotpoint 34c may be utilized in modelling the third electromagnetic field for one or more dipole sources 36a-36b of the bipole source. The third electromagnetic data may include information received from one or more electromagnetic sensors 10a-10d. The third electromagnetic field may be used as a data point in determining the electromagnetic field for the bipole source 12. For example, the third electromagnetic field may be combined with additional data points, such as the first electromagnetic and the second electromagnetic field to provide the approximation of the electromagnetic field of the bipole source 12. Combining the data points may include integrating across the data points.

Referring to FIG. 3d, in some embodiments, a fourth electromagnetic field may be modelled for use in approximating the electromagnetic field for the bipole source 12. For example, the fourth electromagnetic field may be modelled based on fourth electromagnetic data received from fourth shotpoint 34d of the marine electromagnetic survey. The fourth electromagnetic data received for the fourth shotpoint 34d may be utilized in modelling the fourth electromagnetic field for one or more dipole sources 36a-36b of the bipole source. The fourth electromagnetic data may include information received from one or more electromagnetic sensors 10a-10d. The fourth electromagnetic field may be used as a data point in determining the electromagnetic field for the bipole source 12. For example, the fourth electromagnetic field may be combined with additional data points to provide the approximation of the electromagnetic field of the bipole source 12. Combining the data points may include integrating across the data points.

Referring to FIG. 3e, in some embodiments, a fifth electromagnetic field may be modelled for use in approximating the electromagnetic field for the bipole source 12. For example, the fifth electromagnetic field may be modelled based on fifth electromagnetic data received from fifth shotpoint 34e of the marine electromagnetic survey. The fifth electromagnetic data received for the fifth shotpoint 34e may be utilized in modelling the fifth electromagnetic field for one or more dipole sources 36a-36b of the bipole source. The fifth electromagnetic data may include information received from one or more electromagnetic sensors 10a-10d. The fifth electromagnetic field may be used as a data point in determining the electromagnetic field for the bipole source 12. For example, the fifth electromagnetic field may be combined with additional data points to provide the approximation of the electromagnetic field of the bipole source 12. Combining the data points may include integrating across the data points.

This modelling technique represented on FIGS. 3a-3e may be repeated as many number of times as needed to provide one or more approximations of the electromagnetic field for the bipole source 12. For example, additional electromagnetic data from one or more additional shotpoints of the marine electromagnetic survey may be received. One or more additional electromagnetic fields may be modeled from the additional electromagnetic data at the one or more additional points. To provide another approximation of the electromagnetic field for the bipole source, the one or more additional electromagnetic fields may be combined with at least a portion of the data points that were previously modelled. The inclusion of previously modelled electromagnetic fields for the dipole sources 36a-36b may reduce the computational load on data processing system, which may reduce the time to model an electromagnetic field and increase accuracy.

Therefore, the present disclosure may be well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Although individual embodiments are discussed, the disclosure covers all combinations of all those embodiments. Furthermore, no limitations are intended to the details of construction or design herein shown, other than as disclosed in the claims below. It is therefore evident that the particular illustrative embodiments disclosed above may be altered or modified and all such variations are considered within the scope and spirit of the present disclosure. All numbers and ranges disclosed above may vary by some amount. Whenever a numerical range with a lower limit and an upper limit is disclosed, any number and any included range falling within the range are specifically disclosed. Moreover, the indefinite articles "a" or "an," as used in the claims, are defined herein to mean one or more than one of the element that it introduces. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification may be adopted for the purposes of understanding this disclosure.

What is claimed:

1. A method, comprising:
receiving first electromagnetic data from a first shotpoint of a marine electromagnetic survey with a bipole source, the first shotpoint being from the bipole source, wherein the bipole source is towed and the bipole source comprises a pair of electrodes separated by a distance of about 100 meters to about 1,000 meters;
receiving second electromagnetic data from a second shotpoint of the marine electromagnetic survey, the second shotpoint being from the bipole source;
modelling a first electromagnetic field for one or more dipole sources of the bipole source from the first electromagnetic data;
modelling a second electromagnetic field for the one or more dipole sources from the second electromagnetic data; and
combining, via integration, a plurality of data points to provide an approximation of an electromagnetic field for the bipole source, wherein the plurality of data points comprise the first electromagnetic field and the second electromagnetic field and the first electromagnetic data and the second electromagnetic data each comprise measurements of a potential difference.

2. The method of claim 1, further comprising receiving third electromagnetic data from a third shotpoint of the marine electromagnetic survey, and modelling a third electromagnetic field for the one or more dipole sources from the third electromagnetic data, wherein the plurality of data points further comprise the third electromagnetic field.

3. The method of claim 2, further comprising receiving fourth electromagnetic data from a fourth shotpoint of the marine electromagnetic survey, and modelling a fourth electromagnetic field for the one or more dipole sources from the fourth electromagnetic data, wherein the plurality of data points further comprise the fourth electromagnetic field.

4. The method of claim 3, further comprising receiving additional electromagnetic data from an additional shotpoint of the marine electromagnetic survey, and modelling an additional electromagnetic field for the one or more dipole sources from the additional electromagnetic data, and combining the additional electromagnetic field with at least a portion of the plurality of data points to provide another approximation of the electromagnetic field for the bipole source.

5. The method of claim 1, further comprising activating the bipole source at a plurality of shotpoints and collecting electromagnetic data for each of the plurality of shotpoints, wherein the shotpoints comprise the first shotpoint and the second shotpoint.

6. The method of claim 1, further comprising recording the approximation of the electromagnetic field on one or more non-transitory computer readable media thereby creating a geophysical data product.

7. An electromagnetic survey system, comprising a data processing system configured to receive electromagnetic data from a plurality of shotpoints of a bipole source, wherein the bipole source is towed, wherein the bipole source comprises a pair of electrodes separated by a distance of about 100 meters to about 1,000 meters, model electromagnetic fields for one or more dipole sources of the bipole source from the electromagnetic data; and combine, via integration, a plurality of data points to provide an approximation of an electromagnetic field for the bipole source, wherein the data points comprise the electromagnetic fields for the one or more dipole sources and wherein electromagnetic data from each of the plurality of shotpoints comprise measurement of a potential difference.

8. The electromagnetic survey system of claim 7, further comprising a survey vessel, electromagnetic sensors coupled to the survey vessel, and a bipole source coupled to the survey vessel, wherein the bipole source comprise a pair of electrodes that are separated by a distance, wherein the bipole source is configured to generate the electromagnetic field.

9. A method to manufacture a geophysical data product, comprising:
  receiving, with a data processing system, electromagnetic data from a plurality of shotpoints of a marine electromagnetic survey, the plurality of shotpoints being from a bipole source, wherein the bipole source is towed, wherein the bipole source comprises a pair of electrodes separated by a distance of about 100 meters to about 1,000 meters;
  modelling, with the data processing system, electromagnetic fields for one or more dipole sources of the bipole source from the electromagnetic data wherein the electronic data comprises measurement of a potential difference;
  combining, via integration, with the data processing system, a plurality of data points to provide an approximation of an electromagnetic field for the bipole source, wherein the data points comprise the electromagnetic fields for the one or more dipole sources; and
  recording, with the data processing system, the approximation of the electromagnetic field for the bipole source on one or more non-transitory computer readable media thereby creating the geophysical data product.

10. The method of claim 9, further comprising importing the geophysical data product onshore and performing further data processing or geophysical analysis on the geophysical data product.

11. The method of claim 9, further comprising, receiving, with the data processing system, third electromagnetic data from a third shotpoint of the marine electromagnetic survey and modelling, with the data processing system, a third electromagnetic field for the one or more dipole sources from the third electromagnetic data, wherein the plurality of data points further comprise the third electromagnetic field.

12. The method of claim 11, further comprising receiving, with the data processing system, system, fourth electromagnetic data from a fourth shotpoint of the marine electromagnetic survey, and modelling, with the data processing system, a fourth electromagnetic field for the one or more dipole sources from the fourth electromagnetic data, wherein the plurality of data points further comprise the fourth electromagnetic field.

13. The method of claim 9, further comprising receiving, with the data processing system, additional electromagnetic data from an additional shotpoint of the marine electromagnetic survey, and modelling, with the data processing system, an additional electromagnetic field from the additional electromagnetic data at the additional shotpoint, and combining the additional electromagnetic field with at least a portion of the data points to provide another approximation of the electromagnetic field for the bipole source.

14. A non-transitory computer-readable medium encoded with machine-readable instructions to control one or more processors of a data processing system to perform the operations of:
  receiving electromagnetic data from a plurality of shotpoints of a marine electromagnetic survey, the plurality of shotpoints being from a towed bipole source, wherein the bipole source comprises of a pair of electrodes separated by a distance of about 100 meters to about 1,000 meters;
  modelling electromagnetic fields for one or more dipole sources of the bipole source from the electromagnetic data; and
  combining a plurality of data points by integrating across the plurality of data points, to provide an approximation of an electromagnetic field for the towed bipole source, wherein the data points comprise the electromagnetic fields for the one or more dipole sources, wherein the approximation of the electromagnetic field for the towed bipole source and the electromagnetic fields for the one or more dipole sources comprise measurements of a potential difference.

* * * * *